United States Patent
Kato

(10) Patent No.: US 7,405,486 B2
(45) Date of Patent: Jul. 29, 2008

(54) CIRCUIT DEVICE

(75) Inventor: Atsushi Kato, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 116 days.

(21) Appl. No.: 11/040,931

(22) Filed: Jan. 21, 2005

(65) Prior Publication Data
US 2005/0212110 A1 Sep. 29, 2005

(30) Foreign Application Priority Data
Mar. 26, 2004 (JP) ............................. P2004-092561

(51) Int. Cl.
H01L 23/48 (2006.01)

(52) U.S. Cl. .......................... 257/777; 257/723; 257/780; 257/784; 257/787; 257/E23.014; 257/E23.079

(58) Field of Classification Search ................. 257/522, 257/685, 686, 735, 736, 691, 723, 726, 777, 257/778, 780–786, E23.014, E23.079, E25.031, 257/E25.032, E25.042; 438/6, 28, 66, 67, 438/107, 109, 406, 455–459, FOR. 220, FOR. 365, 438/FOR. 366, FOR. 367, FOR. 368
See application file for complete search history.

(56) References Cited

U.S. PATENT DOCUMENTS 6,476,331 B1* 11/2002 Kim et al. .................. 174/261
6,576,997 B2* 6/2003 Uchida ....................... 257/723
6,833,287 B1* 12/2004 Hur et al. .................... 438/107
7,034,388 B2* 4/2006 Yang et al. ................. 257/686
2002/0096780 A1* 7/2002 Chen et al. ................. 257/777
2002/0140073 A1* 10/2002 Pai et al. .................... 257/686

FOREIGN PATENT DOCUMENTS

| JP | 11-354714 | 12/1999 |
|---|---|---|
| JP | 2002-368189 | 12/2002 |

* cited by examiner

Primary Examiner—Jasmine J Clark
(74) Attorney, Agent, or Firm—Fish & Richardson P.C.

(57) ABSTRACT

In stack packaging, an IC chip in an upper layer and an IC chip in a lower layer are insulated from each other by use of an insulating adhesive and the like. Thus, if an analog IC chip is stacked in the upper layer, a substrate is set in a floating state. Accordingly, there arises a problem that desired characteristics cannot be obtained. A conductive layer is disposed on an IC chip, and an analog IC chip is fixed on the conductive layer. The conductive layer is connected to a fixed potential pattern through a bonding wire and the like. Thus, a fixed potential can be applied to a rear surface (substrate) of the analog IC chip. Consequently, a mounting structure including the analog IC chip stacked in the upper layer can be realized. In addition, versatility of stack packaging for a circuit device including the analog IC chip can be improved, and a mounting area can be reduced. Moreover, characteristics can be improved.

10 Claims, 6 Drawing Sheets

CIRCUIT DEVICE

BACKGROUND OF THE INVENTION

1. Field of the Invention

The present invention relates to a circuit device in which a plurality of IC chips are stacked, and more particularly relates to a circuit device in which an IC chip having a fixed substrate potential is stacked in an upper layer.

2. Description of the Related Art

Along with high integration and downsizing of semiconductor integrated circuits, a stacked circuit device is one of configurations which draw attention as a high-integration IC.

FIG. 6 is a cross-sectional view showing a configuration of a conventional stacked circuit device.

A plurality of wirings 156 are provided on one surface of a substrate 150, and a first IC chip 151 is fixed thereto with an adhesive material 159 interposed therebetween. Moreover, a second IC chip 152 is stacked thereon with an insulating adhesive material 160 interposed therebetween. On surfaces of the respective IC chips 151 and 152, electrode pads (not shown) are provided, respectively, which are connected to the wirings 156 provided on the substrate 150 through bonding wires 153 or the like. The respective wirings 156 are connected to external terminals 154 such as solder balls, which are provided on a rear surface of the substrate 150, through through-holes TH provided in the substrate 150.

The IC chips 151 and 152, bonding wires 153, and wirings 156 are sealed and packaged by use of a sealing resin 155. This technology is described for instance in Japanese Patent Application Publication No. 2002-368189.

In the stacked circuit device as described above, fixing of the second IC chip 152 is performed by use of the adhesive material 160 such as a die-attach sheet and an insulating adhesive in order to insulate the second IC chip 152 from the first IC chip 151. Specifically, a substrate of the second IC chip 152 is mounted in a floating state.

However, for example, in the case where an IC chip used by fixing a substrate potential, such as a bipolar IC, is desired to be used as the second IC chip 152, if the second IC ship 152 is stacked in an upper layer, the substrate potential is set in a floating state. Accordingly, there arises a problem that sufficient characteristics cannot be obtained.

Thus, in a circuit device including an IC chip used with a fixed potential, such as the bipolar IC, the IC chip used with the fixed potential is disposed in a bottom layer in the case of stack packaging. Consequently, versatility of the stack packaging is limited.

Moreover, as to devices in which the stack packaging cannot be realized, the IC chip used with the fixed potential is disposed on an approximately planar surface, and the like. Thus, there also arises a problem that a mounting area is increased.

SUMMARY OF THE INVENTION

The present invention provides a circuit device that includes a plurality of conductive patterns including a fixed potential pattern, a plurality of IC chips including an IC chip having a fixed substrate potential, and a conductive layer. In the circuit device, the IC chip having the fixed substrate potential is fixed on the conductive layer, the plurality of IC chips are stacked and mounted so as to set the IC chip in an upper layer, and the conductive layer is connected to the fixed potential pattern.

According to the present invention, in the circuit device including the plurality of IC chips stacked and mounted, the IC chip having the fixed substrate potential can be stacked in a second layer or higher without setting the chip in a floating state.

Thus, versatility of stack packaging for the circuit device including the IC chip having the fixed substrate potential can be improved. Moreover, a mounting area can be reduced, and bare chip characteristics of the IC chip can be maintained.

DESCRIPTION OF THE EMBODIMENTS

With reference to FIGS. 1 to 5, an embodiment of the present invention will be described.

Figure 1:
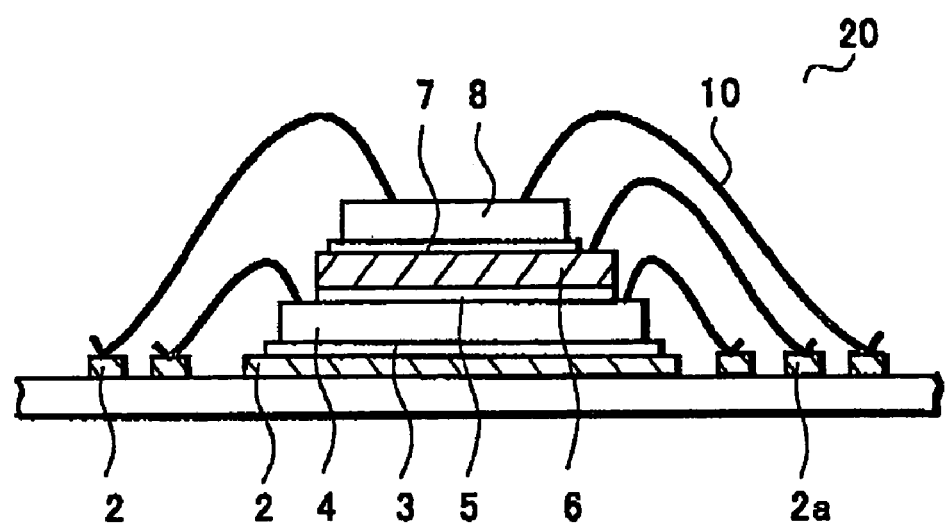
FIG. 1 is a cross-sectional view showing a circuit device according to an embodiment of the present invention.
Figure 2A:
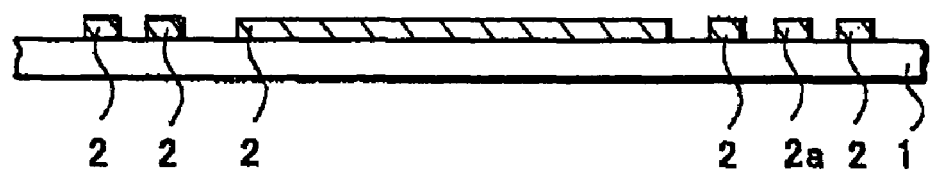
FIGS. 2A and 2B are cross-sectional views showing a method for manufacturing a circuit device according to an embodiment of the present invention.
Figure 2B:
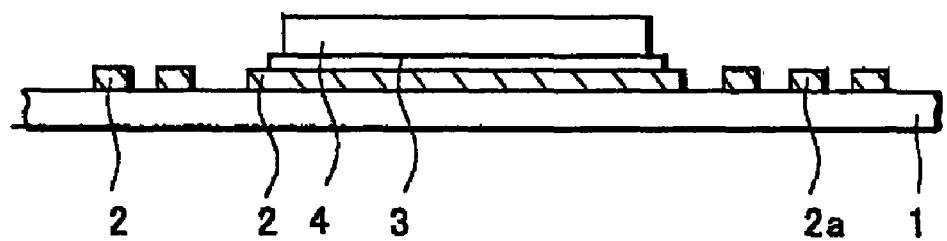

FIG. 1 is a cross-sectional view showing a circuit device of this embodiment.

The circuit device 20 includes a plurality of conductive patterns, a plurality of IC chips, and a conductive layer. The plurality of IC chips include an IC chip having a substrate potential fixed. In this embodiment, description will be given of an example where two chips including the IC chip 8 having the fixed substrate potential and the other IC chip 4 are stacked and mounted.

The plurality of conductive patterns 2 are supported by a support material 1 in a predetermined wiring pattern. The conductive patterns 2 may be formed on a surface of the support material 1 by using an insulating substrate such as a printed board as the support material 1. Alternatively, the conductive patterns 2 may be embedded in and supported by the support material 1 by using an insulating resin as the support material 1. Moreover, if a lead frame is used as the support material 1, the conductive patterns 2 are leads.

The conductive patterns 2 include at least one fixed potential pattern 2a to which a GND potential (or a VDD potential) is applied. Note that the fixed potential pattern 2a will be hereinafter referred to as a GND pattern.

The first IC chip 4 to be a first layer is a bare chip, has an electrode pad (not shown) on a surface thereof, and has a rear surface fixed to the conductive pattern 2, for example. Note that the first IC chip 4 is fixed to the support material 1 by use of an insulating or conductive adhesive material 3, depending on a configuration of the first IC chip 4. Moreover, the first IC chip 4 may not be fixed on the conductive pattern 2, depending on the configuration thereof.

The electrode pad of the first IC chip 4 is connected to the conductive pattern 2 through a bonding wire 10 and the like.

On the surface of the first IC chip 4, the conductive layer 6 is disposed with an insulating layer 5, such as an insulating adhesive, interposed therebetween. The conductive layer 6 needs to have predetermined strength so that the layer can withstand pressure bonding in wire bonding. In addition, the conductive layer 6 is formed by using a silicon substrate, polyimide, an epoxy resin or the like, for example, as a core, and by covering aluminum or the like to its surface as a conductive foil or forming an evaporated metal film.

Moreover, no core is required if the predetermined strength can be obtained by use of a copper foil or the like, and the copper foil may be fixed directly to the insulating layer 5 to form the conductive layer 6. In the case of using the copper foil, a wire bonding region is subjected to plating and the like, according to the bonding wires to be used.

On the conductive layer 6, the second IC chip 8 of a second layer is fixed by use of a conductive adhesive 7. The second IC chip 8 is an IC chip used by applying a fixed potential to a substrate (chip rear surface), such as a bipolar transistor, and is a bare chip of an analog IC, for example. Note that, in the present specification, the analog IC chip will be described below as an example. However, without being limited thereto, the IC chip may be one which requires application of the fixed potential to the substrate as described above. Moreover, here, the fixed potential means a potential which is never changed, such as the GND potential and the VDD potential.

Also on a surface of the second IC chip 8, an electrode pad (not shown) is provided, which is connected to the conductive pattern 2 through the bonding wire 10 and the like.

The conductive layer 6 is connected to the GND pattern 2a through the bonding wire 10 and the like. The GND pattern 2a is the conductive pattern 2 to which the fixed potential is applied, as described above. Accordingly, in the second IC chip 8, the substrate is fixed at the GND potential through the conductive layer 6 and the GND pattern 2a. In other words, the second IC chip 8 is never set in a floating state. Thus, sufficient characteristics can be obtained.

For example, in the case of a circuit device used in a digital TV receiver, an IC chip for digital signal processing and an IC chip for receiver may be integrally molded. In this case, the first IC chip 4 is the IC chip for digital signal, and the second IC chip 8 is the IC chip for receiver.

Figure 6:
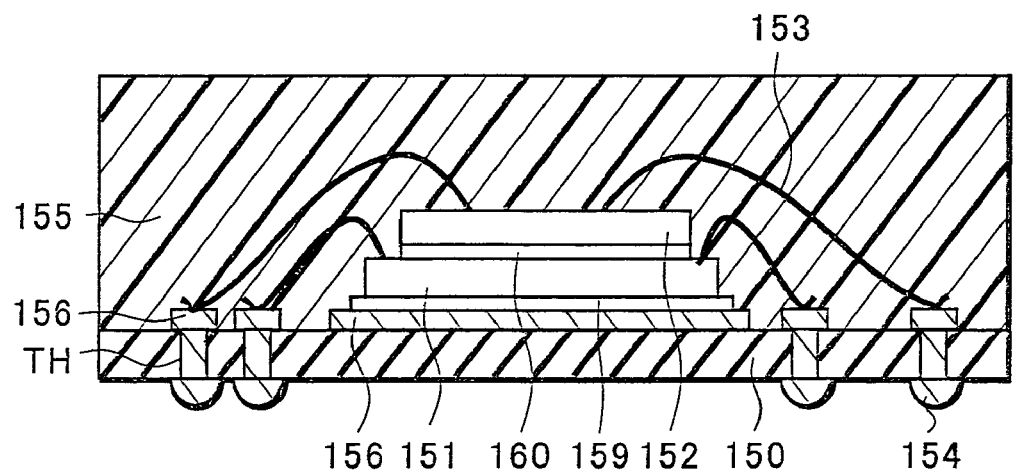
FIG. 6 is a cross-sectional view showing a conventional circuit device.

The analog IC such as the bipolar transistor is generally used by fixing the potential of the substrate. However, in a conventional stack structure as shown in FIG. 6, a substrate cannot be set at a fixed potential. Thus, it is difficult to stack the analog IC in an upper layer.

However, according to this embodiment, the GND potential can be applied to the conductive layer 6 by allowing the conductive layer 6 to come into contact with a rear surface (the substrate) of the second IC chip 8 of the upper layer. Thus, the analog IC chip can be stacked in the upper layer without impairing characteristics in a bare chip state. Consequently, versatility of stack packaging can be improved, and a mounting area can be reduced.

Next, with reference to FIGS. 2 and 3, description will be given of an example of a manufacturing method of this embodiment.

The first step (see FIG. 2A): support material 1 is prepared, on which conductive patterns 2 including fixed potential pattern 2a are provided. Here, as to the conductive patterns 2, as an example, description will be given of those formed on the surface of the support material 1 by using insulating substrate such as printed board as the support material 1. Alternatively, the conductive patterns 2 may be embedded in and supported by the support material 1 by using insulating resin as the support material 1. Moreover, if the lead frame is used as the support material 1, the conductive patterns 2 are the leads.

The second step (see FIG. 2B): adhesive 3 is applied onto the conductive patterns 2. In this case, according to usage of the first IC chip to be mounted, an insulating or conductive adhesive may be used. Thereafter, the first IC chip 4 is fixed thereon.

The third step (see FIG. 3A): conductive layer 6 is prepared. Here, the conductive layer 6 has a structure in which a silicon substrate 6a is provided as a core and an evaporated metal film 6b such as aluminum, for example, is formed on a surface thereof. On a rear surface of the conductive layer 6 (the silicon substrate 6a), an insulating adhesive sheet 5 (or an adhesive) is attached.

Figure 3A:
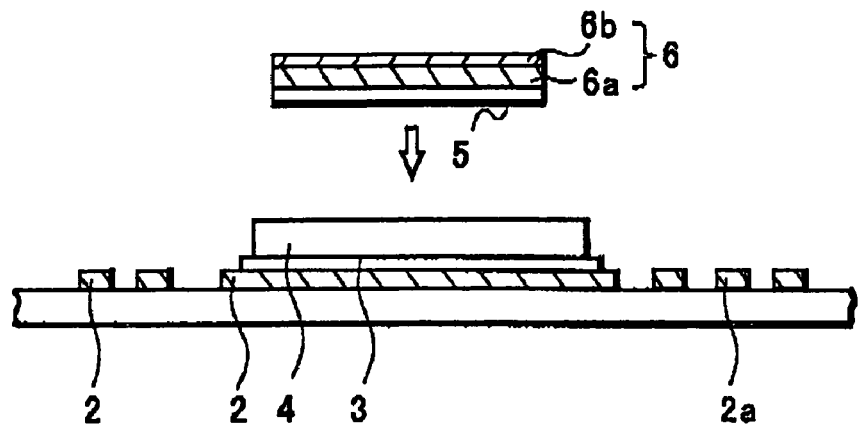
FIGS. 3A to 3C are cross-sectional views showing the method for manufacturing a circuit device according to an embodiment of the present invention.
Figure 3B:
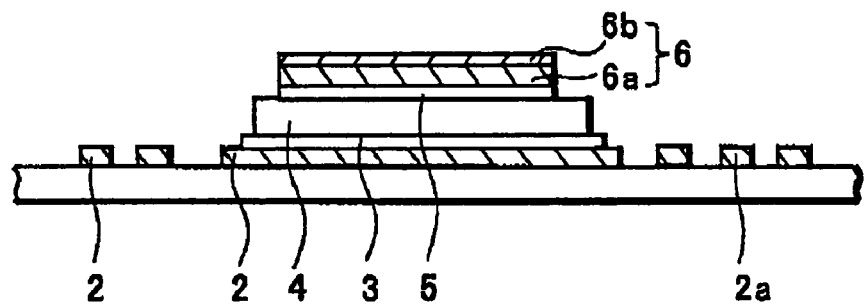
Figure 3C:
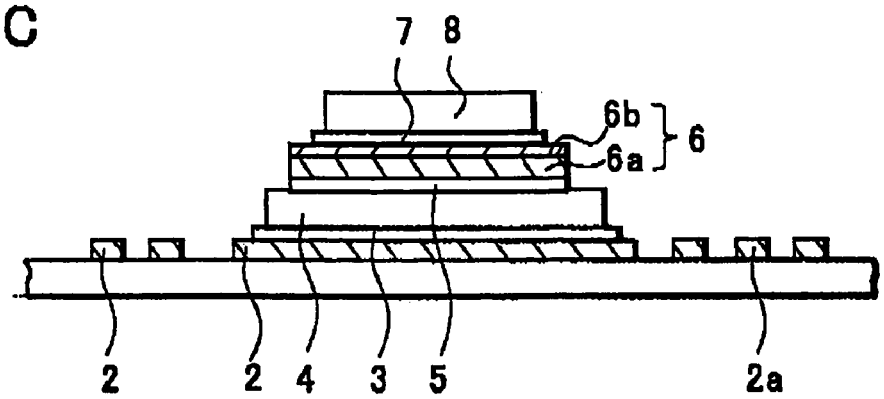

Thereafter, as shown in FIG. 3B, the conductive layer 6 is mounted on the first IC chip 4 and is fixed thereto by use of the insulating adhesive sheet 5. Note that the electrode pad is provided on the surface of the first IC chip 4. Thus, as a matter of course, the conductive layer 6 is formed to have such a pattern as to expose the electrode pad.

The fourth step (see FIG. 3C): thereafter, conductive adhesive 7 is applied onto the evaporated metal film 6b, and second IC chip 8 is fixed thereon. In this event, the conductive adhesive 7 is applied while a fixing region of wire bonding is left on the conductive layer 6.

Subsequently, by use of bonding wires 10 and the like, the electrode pad of the first IC chip 4 is connected to the conductive pattern 2, and the electrode pad 9 of the second IC chip 8 is connected to the conductive pattern 2. Furthermore, the conductive layer 6 is connected to GND pattern 2a through the bonding wire 10 and the like. Thus, the structure shown in FIG. 1 is obtained. By applying the fixed potential such as GND and VDD to the fixed potential pattern 2a, a substrate potential of the second IC chip 8 is fixed.

Next, with reference to FIGS. 4 and 5, package examples of the above-described circuit device will be described.

Figure 4A:
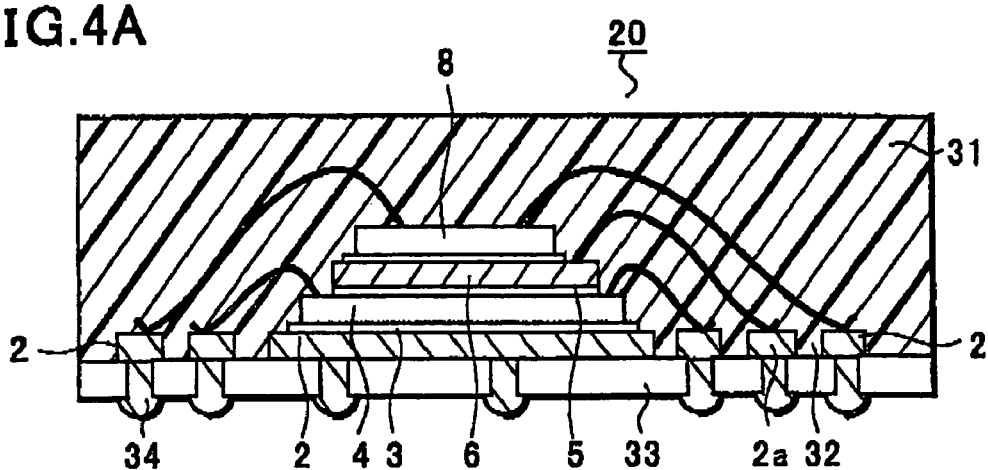
FIGS. 4A to 4C are cross-sectional views showing package examples of the circuit device according to an embodiment of the present invention.
Figure 4B:
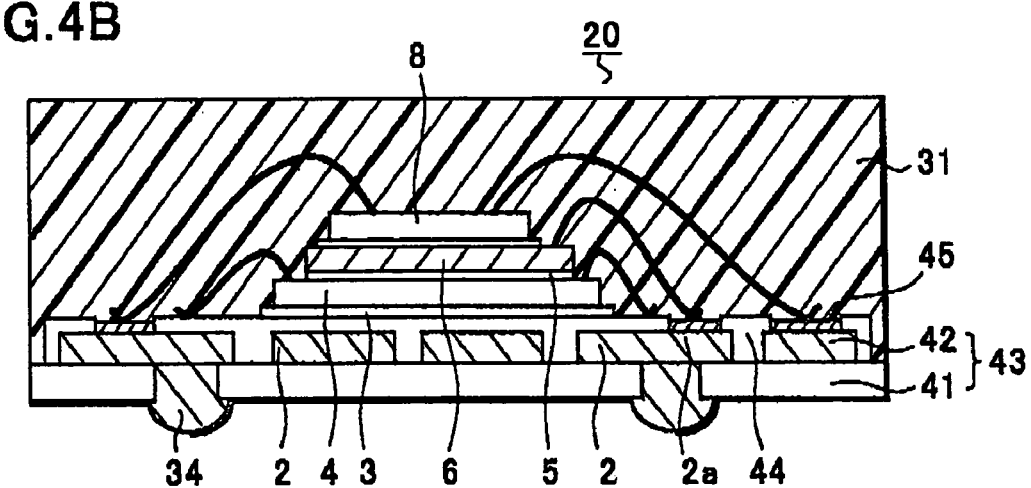
Figure 4C:
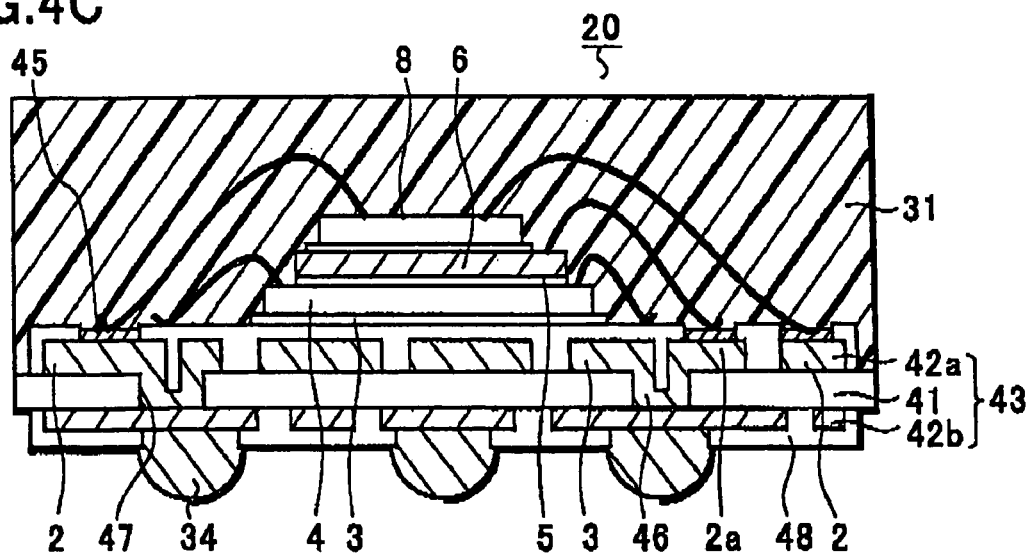

First, with reference to FIGS. 4A to 4C, FIG. 4A shows the circuit device which requires no package board, FIG. 4B shows one packaged by using a resin sheet having conductive patterns, and FIG. 4C is a cross-sectional view in the case of using a substrate having a multi-layered wiring structure.

The circuit device shown in FIG. 4A can be realized in such a manner that, after elements as shown in FIG. 4A are mounted and molded on a supporting substrate having the conductive patterns, for example, the supporting substrate is removed. Moreover, the device can be realized in such a manner that, after a Cu foil is half-etched and the elements are mounted and molded, the Cu foil present on a rear surface of a package is etched back. Furthermore, the device can also be realized by molding while allowing a rear surface of a punched lead frame to abut on a lower mold. Here, description will be given by taking the second case of adopting half etching as an example.

Specifically, as shown in FIG. 4A, the conductive patterns 2 are embedded in and supported by an insulating resin 31, and rear surfaces thereof are exposed from the insulating resin 31. In this case, the conductive patterns 2 are formed of a conductive foil mainly made of Cu, a conductive foil mainly made of Al, a conductive foil made of alloys such as Fe—Ni, or the like. However, other conductive materials can also be used, and particularly, a conductive material which is possible to etching may be used.

In this case, in manufacturing steps, isolation trenches 32 not as deep as a thickness of a sheet-like conductive foil are provided in the conductive foil by half etching. Accordingly, the conductive patterns 2 are formed. Thereafter, the isolation trenches 32 are filled with the insulating resin 31, and are joined with and firmly bonded to a curved structure of sides of the conductive patterns. Thereafter, by etching the conductive foil below the isolation trenches 32, the conductive patterns 2 are individually separated and supported by the insulating resin 31.

Specifically, the insulating resin 31 seals the circuit device 20 and the bonding wires 10 while exposing the rear surfaces of the conductive patterns 2. As the insulating resin 31, a thermosetting resin formed by transfer molding or a thermoplastic resin formed by injection molding can be adopted. To be more specific, a thermosetting resin such as an epoxy resin or a thermoplastic resin such as a polyimide resin and polyphenylene sulfide can be used. Moreover, as the insulating resin, all kinds of resin can be adopted as long as the resin is one hardened by use of a mold or one capable of covering by dipping or coating. In the package described above, the insulating resin 31 also has a function of supporting the entire circuit module as well as sealing the circuit device 20 and the like. As described above, the entire circuit device is sealed by the insulating resin 31. Thus, separation of the circuit device 20 from the conductive patterns 2 can be prevented.

The circuit device 20 is fixed on the conductive pattern (land) 2 by use of the insulating or conductive adhesive 3 according to usage. In addition, the electrode pad has the bonding wire 10 thermocompression-bonded thereto and is connected to the conductive pattern 2. Moreover, the conductive layer 6 also has the bonding wire 10 thermocompression-bonded thereto and is connected to the GND pattern 2a.

Note that a thickness of the insulating resin 31 is controlled so as to cover up to about 100 μm from a top of the bonding wire 10 in the circuit device 20. This thickness can be increased or reduced in consideration for strength.

A rear surface of the insulating resin 31 and the rear surfaces of the conductive patterns 2 are substantially aligned with each other. In addition, on the rear surfaces, an insulating resin (for example, a solder resist) 33 having openings in desired regions is provided. Thereafter, a conductive material such as solder is deposited on the exposed conductive patterns 2 to form back electrodes 34. Thus, the circuit device is completed.

Next, according to the structure as shown in FIG. 4B, degree of freedom of layout of the conductive patterns 2 can be improved.

The conductive patterns 2 are embedded in and supported by the insulating resin 31 integrally with the circuit device 20. As described later, the conductive patterns 2 in this case are formed in such a manner that an insulating resin sheet 43 obtained by forming a conductive film 42 on a surface of an insulating resin 41 is prepared, and the conductive film 42 is patterned.

The insulating resin 41 is formed of an insulating material made of polymers, such as a polyimide resin and an epoxy resin. Moreover, a filler may be mixed therein in consideration for thermal conductivity. As a material of the filler, glass, silicon oxide, aluminum oxide, aluminum nitride, silicon carbide, boron nitride, and the like can be used. A film thickness of the insulating resin 41 is about 10 μm to 100 μm in the case of adopting a casting method for obtaining a sheet by applying a material in the form of paste. Moreover, a commercially available insulating resin has a minimum film thickness of 25 μm.

The conductive film 42 may be formed by use of a material mainly made of Cu, Al, Fe, Fe—Ni or a material of a heretofore known lead frame. The conductive film may be deposited on the insulating resin 41 by use of a plating method, a vapor deposition method or a sputtering method, or may have a metal foil attached thereto, which is formed by use of a rolling method or the plating method.

The conductive patterns 2 are formed in such a manner that the conductive film 42 is covered with a photoresist having desired patterns, and the desired patterns are formed by chemical etching.

The conductive patterns 2 are covered with an overcoat resin 44 except for fixing regions of the bonding wires. The overcoat resin 44 is obtained by attaching an epoxy resin or the like, which is dissolved in a solvent, by screen printing, and thermosetting the resin.

Moreover, in consideration for bonding properties, a plated film 45 such as Au and Ag is formed on the fixing region. This plated film 45 is selectively subjected to electroless plating on the fixing region by use of the overcoat resin 44 as a mask, for example.

The circuit device 20 is die-bonded, as it is as the bare chip, on the overcoat resin 44 by use of the adhesive 3.

The respective electrode pads and conductive layer 6 in the circuit device 20 are connected to the fixing regions of the conductive patterns 2 and the GND pattern 2a through the bonding wires 10.

The insulating resin sheet 43 is covered with the insulating resin 31. Thus, the conductive patterns 2 are also embedded in the insulating resin 31. As a molding method, transfer molding, injection molding, coating, dipping, and the like can also be adopted. However, in consideration for mass productivity, transfer molding and injection molding are suitable.

On the back, a rear surface of the insulating resin sheet 43, that is, the insulating resin 41 is exposed. Openings are formed in desired positions of the insulating resin 41, and external electrodes 34 are provided in portions where the conductive patterns 2 are exposed.

According to the structure described above, the circuit device 20 is electrically insulated from the conductive patterns 2 therebelow by use of the overcoat resin 44. Thus, the conductive patterns 2 can be freely laid out even below the circuit device.

The description has been given above by taking, as an example, the case of the insulating resin sheet 43 having the conductive patterns 2 formed therein. However, without being limited thereto, the conductive patterns 2 shown in FIG. 4A may be covered with the overcoat resin 44. Moreover, the conductive patterns 2 provided on the supporting substrate such as a flexible sheet may be covered with the overcoat resin 44. In either case, the conductive patterns 2 can be laid out below the circuit device. Thus, a package with improved degree of freedom of layout can be realized.

Next, FIG. 4C shows the circuit device in which a multi-layered wiring structure of the conductive patterns 2 is realized. Note that the same constituent components as those in FIG. 4B are denoted by the same reference numerals, and description will be omitted.

The conductive patterns 2 are embedded in and supported by the insulating resin 31 integrally with the circuit device 20. As described later, the conductive patterns 2 in this case are formed in the following manner. Specifically, an insulating resin sheet 43 is prepared, which is obtained by forming a first conductive film 42a on substantially the entire surface of the insulating resin 41 and forming a second conductive film 42b on substantially the entire rear surface thereof. Thereafter, these conductive films 42 are patterned.

The insulating resin 41 and the conductive films 42 are formed by use of the same materials as those in the case of FIG. 4B. The conductive patterns 2 are formed in such a manner that the first and second conductive films 42a and 42b are covered with a photoresist having desired patterns, and the desired patterns are formed by chemical etching.

Moreover, in FIG. 4C, the conductive patterns 2, which are separated into upper and lower layers with the insulating resin 41 interposed therebetween, are electrically connected to each other by multi-layered connections 46. The multi-layered connections 46 are obtained by burying a plated film such as Cu in through-holes 47. Although, here, Cu is used as the plated film, Au, Ag, Pd and the like may be used.

The conductive patterns 2 on the mounting surface are covered with the overcoat resin 44 except for fixing regions of the bonding wires 10. In the fixing regions, the plated film 45 is provided.

The circuit device 20 is die-bonded, as it is as the bare chip, on the overcoat resin 44 by use of the adhesive 3.

The electrode pads and the conductive layer 6 in the circuit device 20 are connected to the conductive patterns 2 and the GND pattern 2a through the bonding wires 10.

The insulating resin sheet 43 is covered with the insulating resin 31. Thus, the conductive patterns 2 formed of the first conductive film 42a are also embedded in and integrally supported by the insulating resin 31.

The conductive patterns 2 formed of the second conductive film 42b below the insulating resin are exposed from the insulating resin 31. However, the conductive patterns are integrally supported by covering a part of the insulating sheet 43 with the insulating resin 31, and are electrically connected to the conductive patterns 2 formed of the first conductive film 42a through the multi-layered connections 46. Thus, the multi-layered wiring structure is realized. Most of the conductive patterns 2 in the lower layer are covered with an overcoat resin 48 while portions where external electrodes 34 are formed are exposed. Specifically, the overcoat resin 48 is obtained by screen printing an epoxy resin or the like, which is dissolved in a solvent. In the exposed portions, the external electrodes 34 are provided by reflowing solder or by screen printing solder cream.

Moreover, the external electrodes 34 can also be accomplished by use of bump electrodes obtained by etching the second conductive film 42b and covering a surface thereof with a gold-plated or palladium-plated film.

Figure 5A:
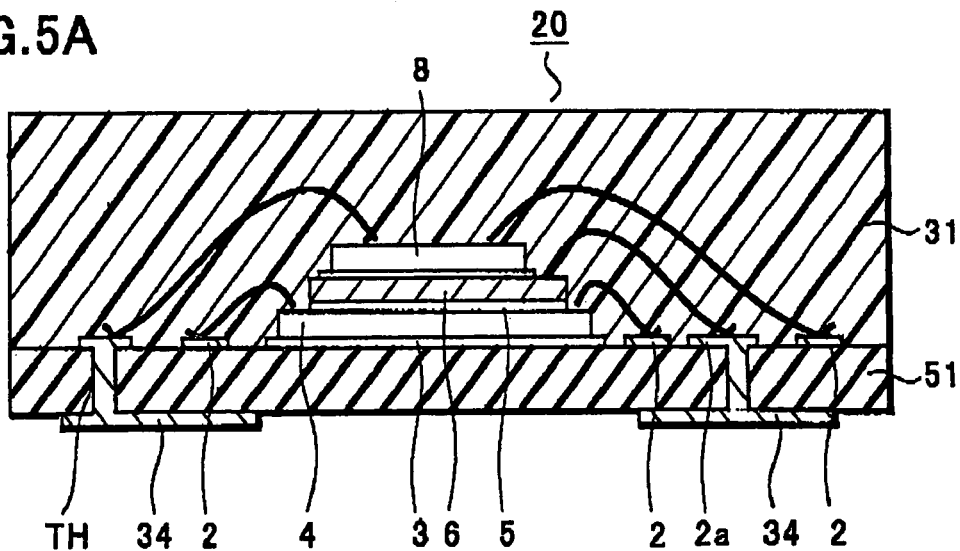
FIGS. 5A and 5B are cross-sectional views showing package examples of the circuit device according to an embodiment of the present invention.
Figure 5B:
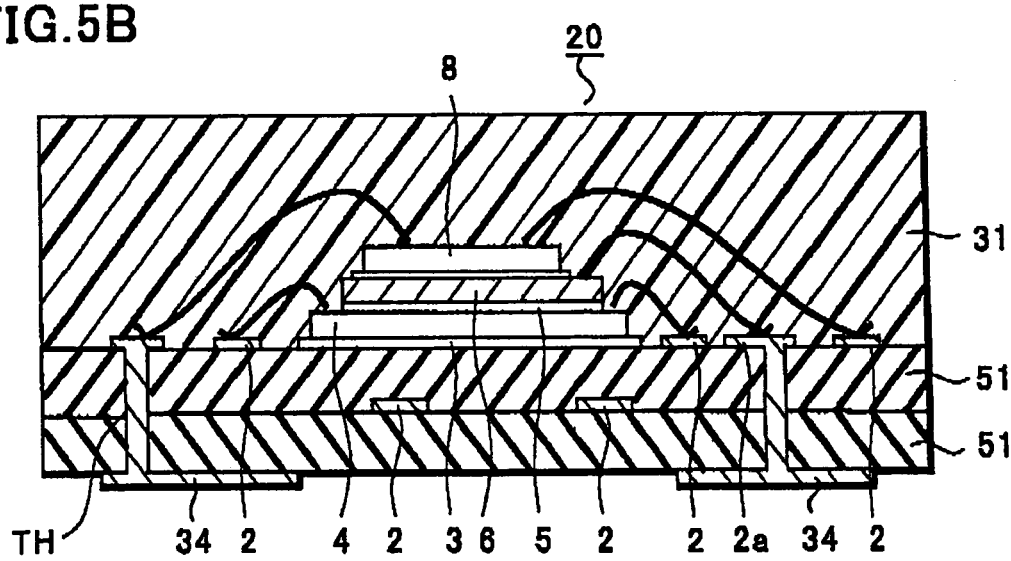

Next, with reference to FIGS. 5A and 5B, description will be given of examples of a chip size package using a supporting substrate. FIG. 5A shows a package in the case where no overcoat resin 44 is required in the package shown in FIG. 4C. FIG. 5B shows a package in the case of a multi-layered wiring structure including three layers or more.

A supporting substrate 51 is an insulating substrate such as a glass epoxy substrate, for example. Note that a flexible sheet can also be used as the supporting substrate 51.

A Cu foil is pressure-bonded to a surface of the glass epoxy substrate 51, patterned conductive patterns 2 are arranged, and back electrodes 34 for external connection are provided on a rear surface of the substrate 51. Through through-holes TH, the conductive patterns 2 and the back electrodes 34 are electrically connected to each other.

On the surface of the substrate 51, the circuit device 20 is fixed by use of the adhesive 3. The electrode pads and the conductive layer 6 in the circuit device 20 have the bonding wires 10 pressure-bonded thereto and are connected to the conductive patterns 2 and the GND pattern 2a.

The circuit device 20, the conductive patterns 2, and the bonding wires 10 are sealed by use of the insulating resin 31 and are supported integrally with the substrate 51. As a material of the insulating resin 31, a thermosetting resin formed by transfer molding or a thermoplastic resin formed by injection molding can be adopted. As described above, by sealing the entire circuit device by use of the insulating resin 31, separation of the circuit device from the substrate can be prevented.

Meanwhile, a ceramic substrate may be used as the supporting substrate 51. In this case, the conductive patterns 2 and the back electrodes 34 are provided by printing and sintering conductive paste on the surface and rear surface of the substrate 51, and are connected to each other through the through-holes TH. Moreover, the substrate 51 and the circuit device 20 are integrally supported by the insulating resin 31.

Moreover, as shown in FIG. 5B, the multi-layered wiring structure can be formed also in the case of having a plurality of supporting substrates 51 by providing conductive patterns 2 to be wiring layers for each of the supporting substrates 51 and connecting the conductive patterns 2 in upper and lower layers to each other through through-holes TH.

Moreover, although not shown, resin molding may be performed by using a lead frame as the supporting substrate, or sealing may be performed by use of a metal case or other casing materials.

Note that this embodiment has been described by taking the stack packaging structure including two layers, as an example. However, stack packaging of two layers or more is also possible by providing the conductive layer 6 on a rear surface of an IC chip desired to have a fixed substrate potential, and connecting the conductive layer 6 to the fixed potential pattern 2a. Moreover, a plurality of analog IC chips which are the second IC chips 8 may be stacked.

Note that, in FIG. 3A, after the first IC chip 4 is mounted, the conductor layer 6 is provided. However, the conductor layer 6 may be provided when the first IC chip 4 is in a wafer state.

Generally, the first IC chip 4 is covered with a passivation film after an electrode in a top layer thereof, for example, the electrode pad and the like are formed. Thereafter, an opening is formed in a part of the passivation film to expose the electrode pad.

However, before the opening is formed, the conductor layer 6 having a wafer size is laminated on the entire wafer with the insulating layer (adhesive insulating resin) 5 interposed therebetween, and the conductor layer 6 is patterned to have a predetermined size as shown in FIG. 3A. Thereafter, the conductive adhesive 7 is laminated on the entire surface, and an opening may be formed in the conductive adhesive 7, the adhesive insulating resin 5 and the passivation film to expose the electrode pad of the first IC chip 4. In such a manner, the first IC chip 4 having the conductor layer 6 mounted thereon can be prepared. Thus, a mounting step can be simplified.

On the other hand, the conductor layer 6 may be formed on a rear surface of the second IC chip 8. In this case, since the bonding wire 10 is fixed to the conductor layer 6, it is required to form the conductor layer 6 to be larger than the second IC chip 8. Specifically, after the second IC chip 8 in a wafer state is separately diced, the conductive adhesive 7, the conductor layer 6, and the adhesive insulating resin 5 are provided on the rear surface of the second IC chip 8. Thereafter, the second IC chip 8 may be laminated on the first IC chip 4 in the wafer state.

What is claimed is:

1. A circuit device comprising:
    a plurality of conductive patterns including a fixed potential pattern, wherein the fixed potential is either a VDD potential or a GND potential;
    a plurality of IC chips which include an IC chip having a fixed substrate potential, wherein the fixed substrate potential is either a VDD potential or a GND potential;
    a conductive layer electrically connected to a rear surface of the IC chip having the fixed substrate potential and to the fixed potential pattern, wherein the IC chip having the fixed substrate potential is fixed on the conductive layer, and further wherein the IC chip having the fixed substrate potential is electrically connected to the fixed potential pattern through the conductive layer; and an insulating layer between the conductive layer and a second IC chip beneath the IC chip having a fixed substrate potential.

2. The circuit device according to claim 1, wherein the plurality of conductive patterns are on a supporting substrate.

3. The circuit device according to claim 1, wherein the plurality of conductive patterns are embedded in and supported by an insulating resin with rear surfaces thereof exposed.

4. The circuit device according to claim 1, wherein the plurality of conductive patterns are sealed by an insulating resin.

5. The circuit device according to claim 1, wherein the plurality of IC chips are stacked and mounted so as to set the IC chip having a fixed substrate potential in a layer above a second IC chip.

6. A circuit device comprising:

a plurality of conductive patterns including a fixed potential pattern, wherein the fixed potential is either a VDD potential or a GND potential;

a plurality of IC chips which include an IC chip having a fixed substrate potential, wherein the fixed substrate potential is either a VDD potential or a GND potential; and a conductive layer electrically connected to a rear surface of the IC chip having the fixed substrate potential and to the fixed potential pattern, wherein the IC chip having the fixed substrate potential is fixed on the conductive layer, wherein the IC chip having the fixed substrate potential is electrically connected to the fixed potential pattern through the conductive layer, wherein the conductive layer comprises a silicon substrate core or resin layer core and wherein at least a portion of a surface of the core is covered with a conductive material.

7. The circuit device according to claim 6, wherein the plurality of conductive patterns are on a supporting substrate.

8. The circuit device according to claim 6, wherein the plurality of conductive patterns are embedded in and supported by an insulating resin with rear surfaces thereof exposed.

9. The circuit device according to claim 6, wherein the plurality of conductive patterns are sealed by an insulating resin.

10. The circuit device according to claim 6, wherein the plurality of IC chips are stacked and mounted so as to set the IC chip having a fixed substrate potential in a layer above a second IC chip.

* * * * *